(12) United States Patent
Park et al.

(10) Patent No.: US 10,121,731 B2
(45) Date of Patent: Nov. 6, 2018

(54) SEMICONDUCTOR DEVICE

(71) Applicant: Samsung Electronics Co., Ltd., Suwon-si (KR)

(72) Inventors: Sang Cheon Park, Hwaseong-si (KR); Won Il Lee, Hwaseong-si (KR); Chajea Jo, Yongin-si (KR); Taeje Cho, Yongin-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/290,899

(22) Filed: Oct. 11, 2016

(65) Prior Publication Data

US 2017/0110388 A1 Apr. 20, 2017

(30) Foreign Application Priority Data

Oct. 19, 2015 (KR) .......... 10-2015-0145652

(51) Int. Cl.

| | |
|---|---|
| *H01L 23/48* | (2006.01) |
| *H01L 23/13* | (2006.01) |
| *H01L 23/522* | (2006.01) |
| *H01L 23/528* | (2006.01) |

(Continued)

(52) U.S. Cl.
CPC .......... *H01L 23/481* (2013.01); *H01L 23/13* (2013.01); *H01L 23/528* (2013.01); *H01L 23/5226* (2013.01); *H01L 23/53228* (2013.01); *H01L 24/05* (2013.01); *H01L 24/03* (2013.01); *H01L 25/0657* (2013.01); *H01L 2224/0346* (2013.01); *H01L 2224/0401* (2013.01); *H01L 2224/05025* (2013.01); *H01L 2224/0557* (2013.01);

(Continued)

(58) Field of Classification Search
CPC . H01L 23/481; H01L 23/528; H01L 23/5226; H01L 23/53228; H01L 24/05; H01L 25/0657; H01L 2224/05025; H01L 2225/06513; H01L 2225/06517; H01L 2224/16146; H01L 2224/16227; H01L 2224/0401; H01L 2225/06541
See application file for complete search history.

(56) References Cited

U.S. PATENT DOCUMENTS 7,795,139 B2    9/2010  Han et al.
7,847,379 B2 *  12/2010 Chung ................ H01L 25/0657
                                                        257/678

(Continued)

FOREIGN PATENT DOCUMENTS

JP   H 07-231049 A    8/1995
KR   10-0895813 B1    5/2009
(Continued)

*Primary Examiner* — David Vu
(74) *Attorney, Agent, or Firm* — Muir Patent Law, PLLC

(57) ABSTRACT

A semiconductor device includes a semiconductor chip having an active surface and a non-active surface opposite to the active surface, an upper insulating layer provided on the non-active surface of semiconductor chip, and a via and a connection pad penetrating the semiconductor chip and the upper insulating layer, respectively. The connection pad has a first surface exposed outside the upper insulating layer and a second surface opposite to the first surface and facing the semiconductor chip. The first surface of the connection pad is coplanar with an upper surface of the upper insulating layer.

19 Claims, 11 Drawing Sheets

(51) Int. Cl.
*H01L 23/532* (2006.01)
*H01L 23/00* (2006.01)
*H01L 25/065* (2006.01)

(52) U.S. Cl.
CPC ............... *H01L 2224/05147* (2013.01); *H01L 2224/05556* (2013.01); *H01L 2224/05559* (2013.01); *H01L 2224/05568* (2013.01); *H01L 2224/05571* (2013.01); *H01L 2224/05647* (2013.01); *H01L 2224/06181* (2013.01); *H01L 2224/1312* (2013.01); *H01L 2224/13023* (2013.01); *H01L 2224/13109* (2013.01); *H01L 2224/13111* (2013.01); *H01L 2224/13113* (2013.01); *H01L 2224/13117* (2013.01); *H01L 2224/13139* (2013.01); *H01L 2224/13147* (2013.01); *H01L 2224/13155* (2013.01); *H01L 2224/16145* (2013.01); *H01L 2224/16146* (2013.01); *H01L 2224/16227* (2013.01); *H01L 2224/16238* (2013.01); *H01L 2225/06513* (2013.01); *H01L 2225/06517* (2013.01); *H01L 2225/06541* (2013.01); *H01L 2225/06544* (2013.01); *H01L 2225/06565* (2013.01); *H01L 2924/01058* (2013.01); *H01L 2924/15311* (2013.01)

(56) References Cited

U.S. PATENT DOCUMENTS

| | | |
|---|---|---|
| 8,987,918 B2 | 3/2015 | Razdan et al. |
| 9,059,053 B2 | 6/2015 | Liang et al. |
| 9,087,885 B2 | 7/2015 | Ji et al. |
| 9,142,510 B2* | 9/2015 | Lee .................... H01L 24/03 |
| 2013/0020719 A1* | 1/2013 | Jung ................. H01L 21/76898 |
| | | 257/774 |
| 2013/0313722 A1 | 11/2013 | Hwang et al. |
| 2014/0175439 A1 | 6/2014 | Lee |
| 2014/0353025 A1 | 12/2014 | Jang et al. |
| 2014/0353026 A1 | 12/2014 | Hattori |
| 2014/0374901 A1 | 12/2014 | Huishu |

FOREIGN PATENT DOCUMENTS

| | | |
|---|---|---|
| KR | 10-2013-0130524 | 12/2013 |
| KR | 10-2014-0141494 | 12/2014 |
| KR | 10-2015-0005289 | 1/2015 |
| KR | 10-1506785 B1 | 3/2015 |
| KR | 10-2015-0052492 | 5/2015 |
| KR | 10-1579666 B1 | 12/2015 |

* cited by examiner

ID DEVICE

CROSS-REFERENCE TO RELATED APPLICATION

This U.S. non-provisional patent application claims the benefit of priority under 35 U.S.C. § 119 to Korean Patent Application No. 10-2015-0145652, filed on Oct. 19, 2015, in the Korean Intellectual Property Office, the disclosure of which is hereby incorporated by reference in its entirety.

BACKGROUND

The disclosed embodiments relate to a semiconductor device and, more particularly, to a semiconductor device in which a top surface of an upper insulating layer provided on a non-active surface of a semiconductor chip is coplanar with a top surface of a connection pad.

The desire for light, small, high-speed and high-performance electronic products has increased with the development of the electronics industry. Thus, research has been conducted to improve performance of semiconductor packages. In particular, to improve the performance of semiconductor packages, through via techniques (e.g., a through silicon via (TSV) technique, or through substrate via technique) have been developed instead of a conventional wire bonding technique. When vias penetrating a substrate are used, lengths of interconnections connecting semiconductor chips may be reduced. As a result, it is possible to improve performance of a three-dimensional semiconductor package. In addition, the vias may have widths of several micrometers, and thus a large number of vias may be formed in semiconductor chips.

SUMMARY

Embodiments may provide a semiconductor device in which a top surface of an upper insulating layer provided on a non-active surface of a semiconductor chip is coplanar with a top surface of a connection pad.

Embodiments may also provide a semiconductor device of which a via and a connection pad can be formed by one plating process.

In some embodiments, the disclosure is directed to a semiconductor device comprising: a semiconductor chip having an active surface and a non-active surface opposite to the active surface; an upper insulating layer provided on the non-active surface of the semiconductor chip; and a via and a connection pad penetrating the semiconductor chip and the upper insulating layer, respectively, wherein the connection pad has a first surface exposed outside the upper insulating layer, and a second surface opposite to the first surface and facing the semiconductor chip, and wherein the first surface of the connection pad is coplanar with an upper surface of the upper insulating layer.

In some embodiments, the disclosure is directed to a semiconductor device comprising: a semiconductor chip having a first surface and a second surface opposite to the first surface; an upper insulating layer provided on the first surface of the semiconductor chip; an interlayer insulating layer provided on the second surface of the semiconductor chip; a via-hole penetrating the semiconductor chip and extending into the interlayer insulating layer; a connection pad provided on the first surface; and a via connected to the connection pad and provided in the via-hole, wherein the connection pad has a bottom surface being in contact with the via and a top surface opposite to the bottom surface, and wherein the top surface of the connection pad is coplanar with a top surface of the upper insulating layer.

In some embodiments, the disclosure is directed to a semiconductor device comprising: a semiconductor chip having an active surface and a non-active surface opposite to the active surface; an upper insulating layer provided on the non-active surface of the semiconductor chip; and an interlayer insulating layer provided on the active surface of the semiconductor chip; a connection pad provided on the non-active surface of the semiconductor chip; and a via connected to the connection pad and provided in a via-hole, wherein the connection pad has a first surface exposed outside the upper insulating layer, and a second surface opposite to the first surface and facing the semiconductor chip, and wherein the first surface of the connection pad is coplanar with an upper surface of the upper insulating layer.

BRIEF DESCRIPTION OF THE DRAWINGS

The disclosed embodiments will become more apparent in view of the attached drawings and accompanying detailed description.

DETAILED DESCRIPTION OF THE EMBODIMENTS

Figure 1:
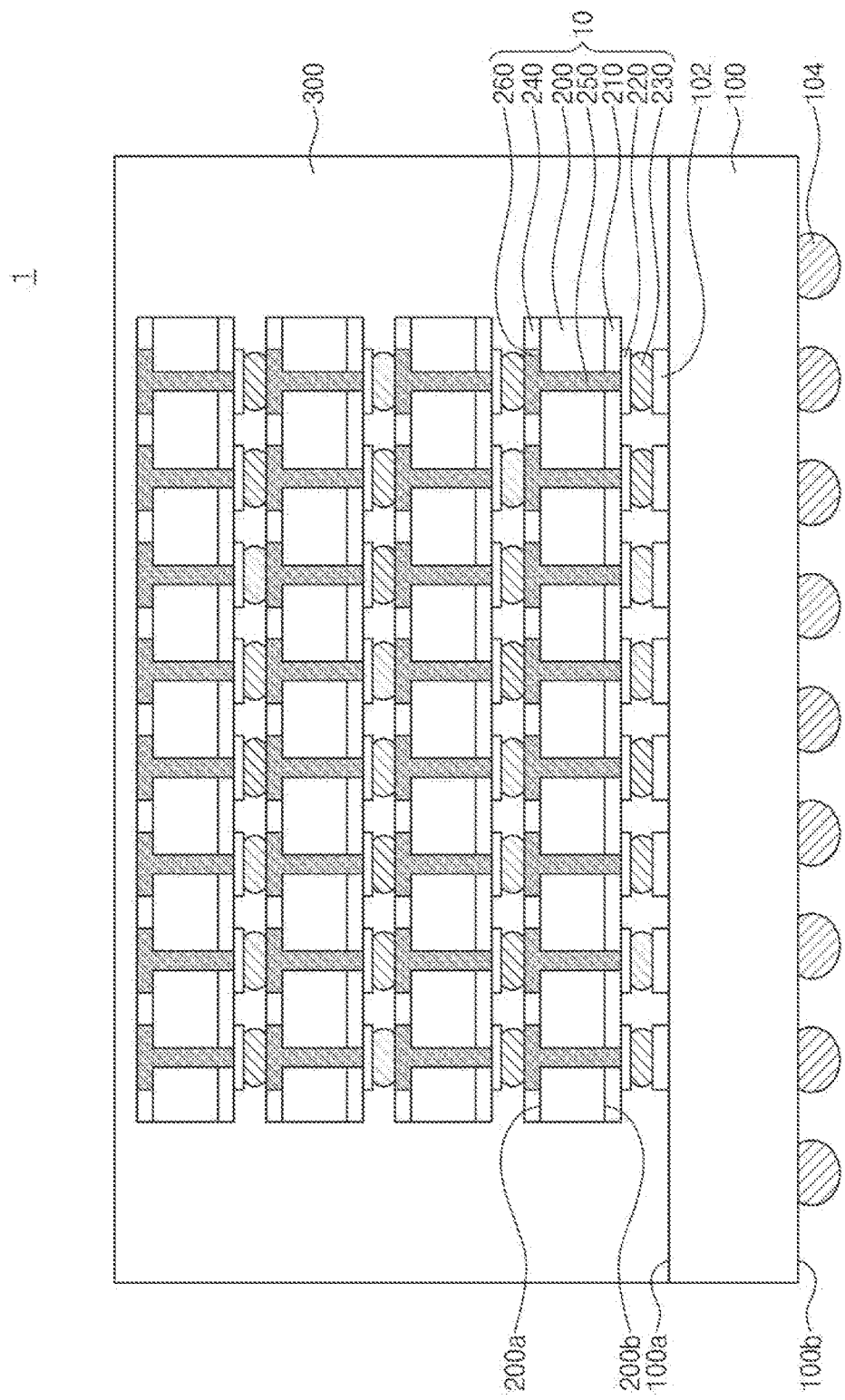
FIG. 1 is a cross-sectional view illustrating a semiconductor package according to some exemplary embodiments.
Figure 2:
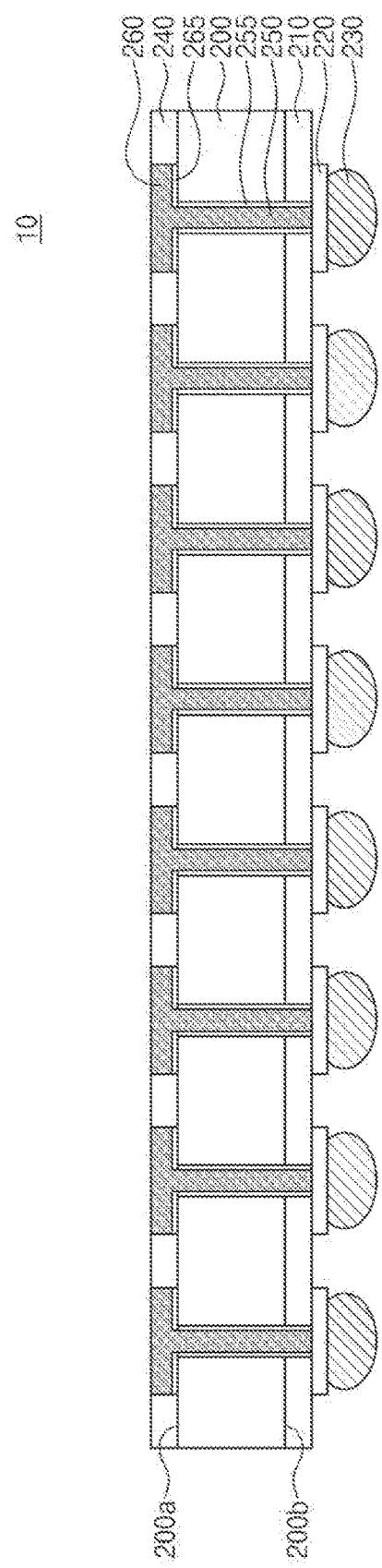
FIG. 2 is a cross-sectional view illustrating a semiconductor device according to some exemplary embodiments.

FIG. 1 is a cross-sectional view illustrating a semiconductor package according to some exemplary embodiments. FIG. 2 is a cross-sectional view illustrating a semiconductor device according to some exemplary embodiments.

Referring to FIGS. 1 and 2, a semiconductor package 1 may include a substrate 100, a plurality of semiconductor devices 10, and a mold layer 300.

The substrate 100 may have a top surface 100a and a bottom surface 100b opposite to the top surface 100a and may be, for example, a printed circuit board (PCB) including a circuit pattern therein. The substrate 100 may be referred to herein as a package substrate. One or more substrate pads 102 may be provided on the top surface 100a of the substrate 100, and one or more substrate terminals 104 such as solder balls may be provided on the bottom surface 100b of the substrate 100.

The plurality of semiconductor devices 10 may be stacked on the substrate 100. The semiconductor devices 10 may be mounted on the substrate 100 by a flip-chip bonding method. Each of the semiconductor devices 10 may include a semiconductor chip 200, an interlayer insulating layer 210, one or more external pads 220, one or more external terminals 230, an upper insulating layer 240, one or more vias 250, and one or more connection pads 260.

The semiconductor chip 200 may include a memory chip, a logic chip, or a combination thereof. The semiconductor chip 200 may have a first surface 200a corresponding to a non-active surface and a second surface 200b corresponding to an active surface. The active surface may be a surface on which an integrated circuit is formed. The non-active surface may be surface opposite the surface on which the integrated circuit is formed. The semiconductor chip 200 may include a chip substrate, for example formed of silicon, on which the integrated circuit is provided. The upper insulating layer 240 may be provided on the first surface 200a of the semiconductor chip 200, and the interlayer insulating layer 210 may be provided on the second surface 200b of the semiconductor chip 200. In some embodiments, the upper insulating layer 240 may be in contact with the first surface 200a of the semiconductor chip 200, and the interlayer insulating layer 210 may be in contact with the second surface 200b of the semiconductor chip 200. The interlayer insulating layer 210 may prevent an electrical short between circuit patterns (not shown) provided in the interlayer insulating layer 210. For example, the interlayer insulating layer 210 may include at least one of a silicon oxide layer, a silicon nitride layer, a silicon oxynitride layer, or a low-k dielectric layer. The upper insulating layer 240 may prevent an electrical short between the connection pads 260. For example, the upper insulating layer 240 may include at least one of a silicon oxide layer, a silicon nitride layer, a silicon oxynitride layer, or a low-k dielectric layer.

The external pad 220 may be provided on the interlayer insulating layer 210. The external pad 220 may be in contact with the via 250 so as to be electrically connected to the via 250. The external terminal 230 may be provided on the external pad 220. The external terminal 230 may be in contact with the external pad 220 so as to be electrically connected to the external pad 220. The external terminal 230 may be a solder ball. For example, the external terminal 230 may include an alloy including at least one of tin (Sn), silver (Ag), copper (Cu), nickel (Ni), bismuth (Bi), indium (In), antimony (Sb), or cerium (Ce).

The various pads described herein may be connected to internal circuitry within the device to which they are connected, and may transmit signals and/or voltage to and/or from the device to which they are attached. For example, substrate pads 102 disposed on the package substrate 100 may connect to rerouting and other electrical lines disposed within the package substrate 100, and the pads 220 and 260 disposed on the semiconductor chips 10 may connect to an integrated circuit on one or more of the semiconductor chips 10. The various pads described herein may generally have a planar surface at a location for connecting to a terminal for external communications outside of the device to which the pads are connected. The pads may be formed of a conductive material, such a metal, for example.

The via 250 may penetrate the semiconductor chip 200 and the interlayer insulating layer 210. The via 250 may be a conductive via, for example, formed of a conductive material such as a metal. The via 250 may electrically connect the external pad 220 to the connection pad 260. The connection pad 260 may be provided in the upper insulating layer 240. The connection pad 260 may not protrude outward from the upper insulating layer 240. For example, a surface (e.g., a top surface) of the connection pad 260 may be coplanar with a surface (e.g., a top surface) of the upper insulating layer 240. The via 250 and the connection pad 260 may include the same metal material, e.g., copper (Cu). The via 250 and the connection pad 260 may be provided in one body (e.g., a single, integral component). As illustrated in FIG. 2, a via insulating layer 255 may be provided between the via 250 and the semiconductor chip 200, and a pad insulating layer 265 may be provided between the connection pad 260 and the semiconductor chip 200. The via insulating layer 255 may be in contact with the pad insulating layer 265. The via insulating layer 255 may prevent an electrical short between the via 250 and the semiconductor chip 200, and the pad insulating layer 265 may prevent an electrical short between the connection pad 260 and the semiconductor chip 200. The via insulating layer 255 and the pad insulating layer 265 may include, for example, silicon oxide, silicon nitride, silicon oxynitride, or polymer.

The mold layer 300 may be provided on the substrate 100 to cover the semiconductor devices 10. For example, the mold layer 300 may be disposed on the substrate 100 and may surround semiconductor devices 10. The mold layer 300 may include an epoxy molding compound (EMC).

In general, when a semiconductor device is moved to be stacked on a substrate, the semiconductor device may be moved with a tape adhered to a surface, provided with a pad, of the semiconductor device to prevent the thin semiconductor device from being warped. The tape may be detached from the semiconductor device after the semiconductor device is stacked. Often, a residue of the tape may remain on a protruding pad. However, according to certain disclosed embodiments, the connection pad 260 may not protrude outward from the upper insulating layer 240, and the surface of the connection pad 260 may be coplanar with the surface of the upper insulating layer 240. For example, the connection pad 260 may not protrude above an upper (e.g., top or top-most) surface of the upper insulating layer 240. In some embodiments, the connection pad 260 also may not protrude below a lower surface of the upper insulating layer 240. Thus, a residue of the tape may not remain on the connection pad 260 when the tape is detached from the semiconductor device 10. In addition, since the connection pad 260 does not protrude outward from the upper insulating layer 240, when the residue of the tape does not remain on the connection pad 260, a thickness of the semiconductor package 1 may be reduced.

Figure 3A:
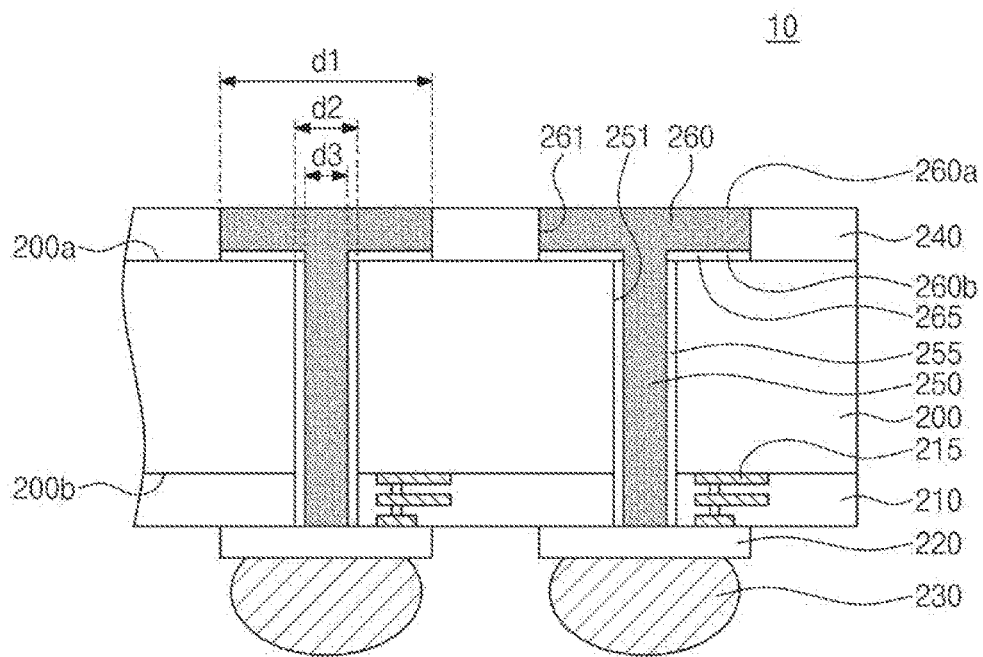
FIGS. 3A and 3B are cross-sectional views illustrating semiconductor devices according to some exemplary embodiments.
Figure 3B:
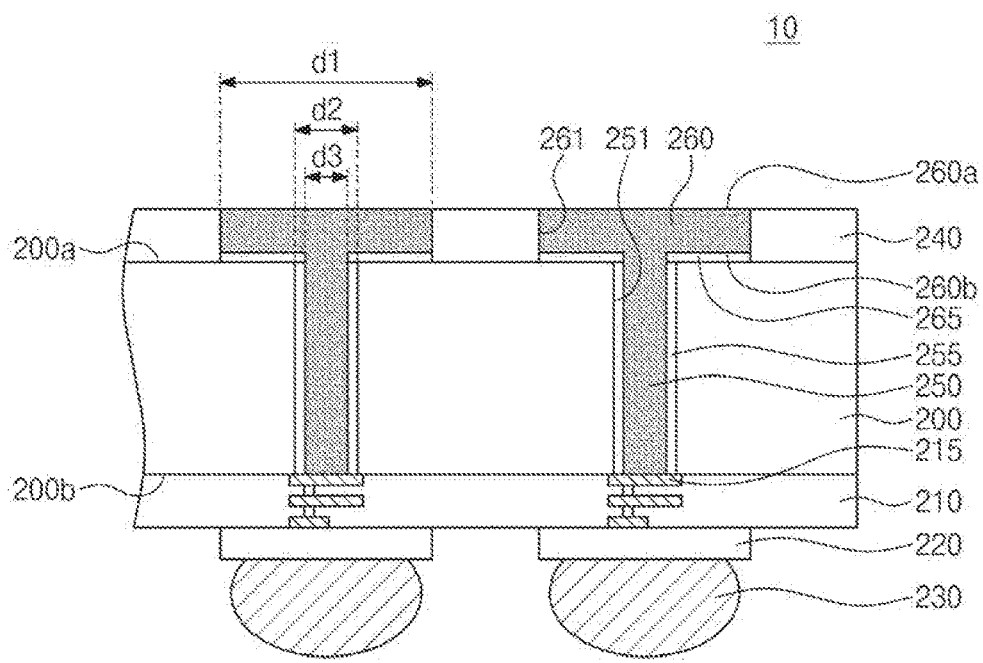

FIGS. 3A and 3B are cross-sectional views illustrating semiconductor devices 10 according to some embodiments. FIGS. 3A and 3B are enlarged views of a portion of the semiconductor device 10 of FIG. 2. Hereinafter, the same descriptions as in the embodiment of FIG. 2 will be omitted or mentioned briefly for the purpose of ease and convenience in explanation.

Referring to FIG. 3A, a semiconductor device 10 may have a via-last structure in which the via 250 is formed after formation of a metal interconnection 215. The metal interconnection 215 may be formed in the interlayer insulating layer 210 of the semiconductor device 10. A via-hole 251 may be provided to penetrate the semiconductor chip 200. The via-hole 251 may extend to penetrate the interlayer insulating layer 210, and extend to the external pad 220. The via 250 may be provided in the via-hole 251. For example, the via 250 may penetrate the semiconductor chip 200 and the interlayer insulating layer 210, and extend to the external pad 220. A recess region 261 may be provided in the upper insulating layer 240. The recess region 261 may be recessed in a direction from the upper insulating layer 240 toward the semiconductor chip 200. For example, the recess region 261 may be recessed from a top surface of the upper insulating layer 240. The connection pad 260 may be disposed in the recess region 261. The connection pad 260 may have the same width d1 as the recess region 261. The width d1 of the recess region 261 (e.g., in a horizontal direction) may be greater than a width d2 of the via-hole 251 (e.g., in a horizontal direction), and the width d1 of the connection pad 260 (e.g., in the horizontal direction) may be greater than a width d3 of the via 250 (e.g., in the horizontal direction).

The via 250 and the connection pad 260 may include the same metal material. For example, the via 250 and the connection pad 260 may include copper (Cu). The via 250 and the connection pad 260 may constitute one body. For example, the via 250 and the connection pad 260 may be formed of the same material as part of the same process, and may form a single, continuous structure. The via 250 and connection pad 260 may be referred to together as a t-shaped via-pad, or as a t-shaped plug, or in some cases as a nail-shaped via-pad, or nail-shaped plug.

The connection pad 260 may have a first surface 260a exposed to the outside of the semiconductor device 10 and a second surface 260b opposite to the first surface 260a. For example, the first surface 260a of the connection pad 260 may face a direction away from the semiconductor device 10 but may not form a protrusion above the semiconductor device 10. The second surface 260b of the connection pad 260 may be in contact with the pad insulating layer 265, and the first surface 260a of the connection pad 260 may be coplanar with the surface of the upper insulating layer 240. Thus, the connection pad 260 may not protrude outward from the upper insulating layer 240. The second surface 260b of the connection pad 260 may be a flat surface. In some embodiments, the second surface 260b of the connection pad 260 may be a planar surface that faces a planar surface of the pad insulating layer 265.

Referring to FIG. 3B, a semiconductor device 10 may have a via-first structure or via-middle structure in which the via 250 is formed before formation of the metal interconnection 215. The semiconductor device 10 may include the interlayer insulating layer 210 in which the metal interconnection 215 is formed. The via-hole 251 may be provided to penetrate the semiconductor chip 200. The via 250 may be provided in the via-hole 251. In other words, the via 250 may penetrate the semiconductor chip 200. The via 250 may be in contact with the metal interconnection 215 formed in the interlayer insulating layer 210, and the metal interconnection 215 may be in contact with the external pad 220. The via 250, the metal interconnection 215, and the external terminal 220 may be electrically connected to each other. The recess region 261 recessed in the direction from the upper insulating layer 240 toward the semiconductor chip 200 may be provided in the upper insulating layer 240. For example, the recess region 261 may be recessed from a top surface of the upper insulating layer 240. The connection pad 260 may be disposed in the recess region 261. The connection pad 260 may have the same width d1 as the recess region 261. The width d1 of the recess region 261 may be greater than the width d2 of the via-hole 251, and the width d1 of the connection pad 260 may be greater than the width d3 of the via 250.

In some embodiments, the via 250 and the connection pad 260 may include the same metal material, e.g., copper (Cu). Alternatively, the via 250 may include copper (Cu), and the connection pad 260 may include at least one selected from various metal materials such as copper (Cu), aluminum (Al), and nickel (Ni).

FIGS. 4A to 4E are cross-sectional views illustrating a method of manufacturing the semiconductor device illustrated in FIG. 3A. FIGS. 4A to 4E are enlarged cross-sectional views corresponding to a portion of the semiconductor device illustrated in FIG. 2. The descriptions to the same technical features as mentioned above will be omitted or mentioned briefly for the purpose of ease and convenience in explanation.

Figure 4A:
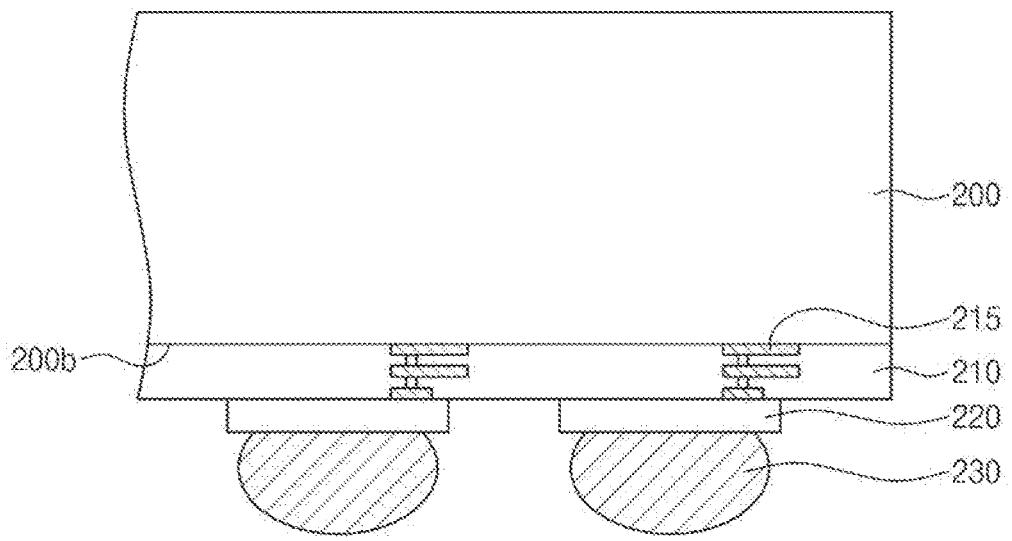
FIGS. 4A to 4E are cross-sectional views illustrating an exemplary method of manufacturing the semiconductor device illustrated in FIG. 3A.

Referring to FIG. 4A, the interlayer insulating layer 210 may be formed on the second surface 200b of the semiconductor chip 200. The metal interconnection 215 may be formed in the interlayer insulating layer 210. The external pad 220 and the external terminal 230 may be sequentially formed on the interlayer insulating layer 210.

Figure 4B:
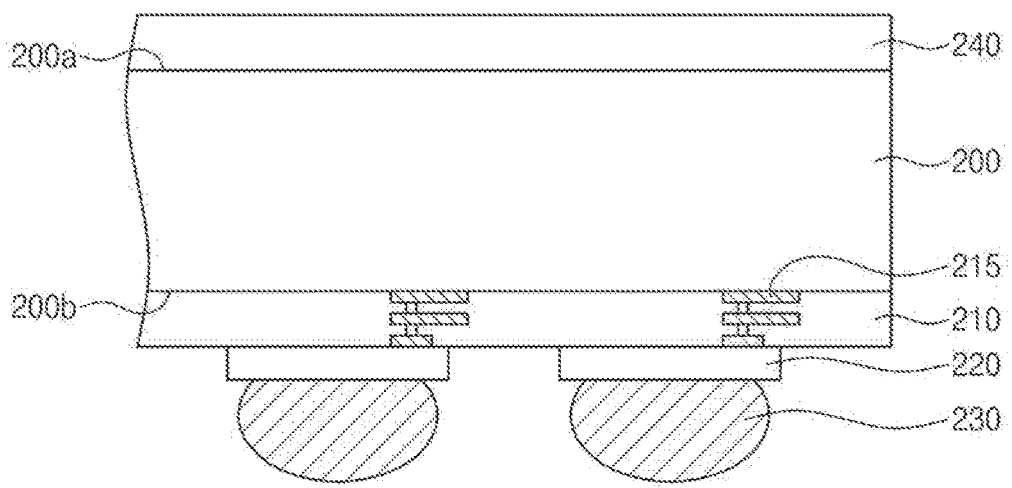

Referring to FIG. 4B, one surface of the semiconductor chip 200 may be polished or ground by a chemical mechanical polishing (CMP) process or a grinding process. The first surface 200a of the semiconductor chip 200 may be exposed by the CMP process or the grinding process. For example, the first surface 200a may be the non-active surface and the second surface 200b may be the active surface. The one surface of the semiconductor chip 200 may be polished or ground to thin the semiconductor chip 200. In some embodiments, a thickness of the semiconductor chip 200 may be reduced using a polishing or grinding process. The upper insulating layer 240 may be formed on the first surface 200a of the polished or ground semiconductor chip 200.

Figure 4C:
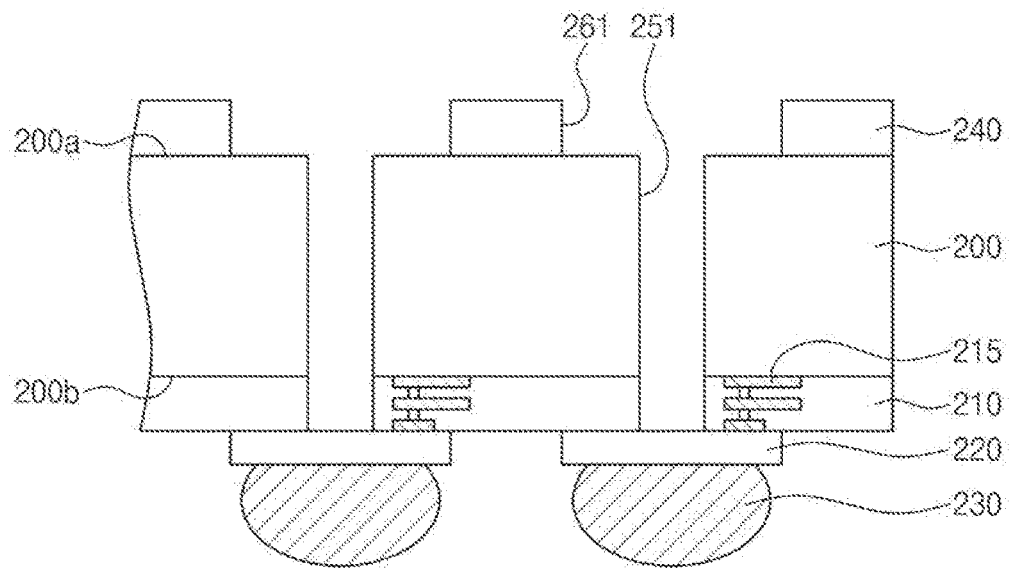

Referring to FIG. 4C, the via-hole 251 penetrating the semiconductor chip 200 and the interlayer insulating layer 210 may be formed using a first etching process, and the recess region 261 recessed in the direction from the upper insulating layer 240 toward the semiconductor chip 200 may be formed in the upper insulating layer 240 by means of a second etching process. The recess region 261 may be recessed from a top surface of the upper insulating layer 240 and may extend in the direction of the first surface 200a. The via-hole 251 may extend from the first surface 200a to the second surface 200b through the semiconductor chip 200 and may further extend from the second surface 200b to the external pad 220 through the interlayer insulating layer 210.

Figure 4D:
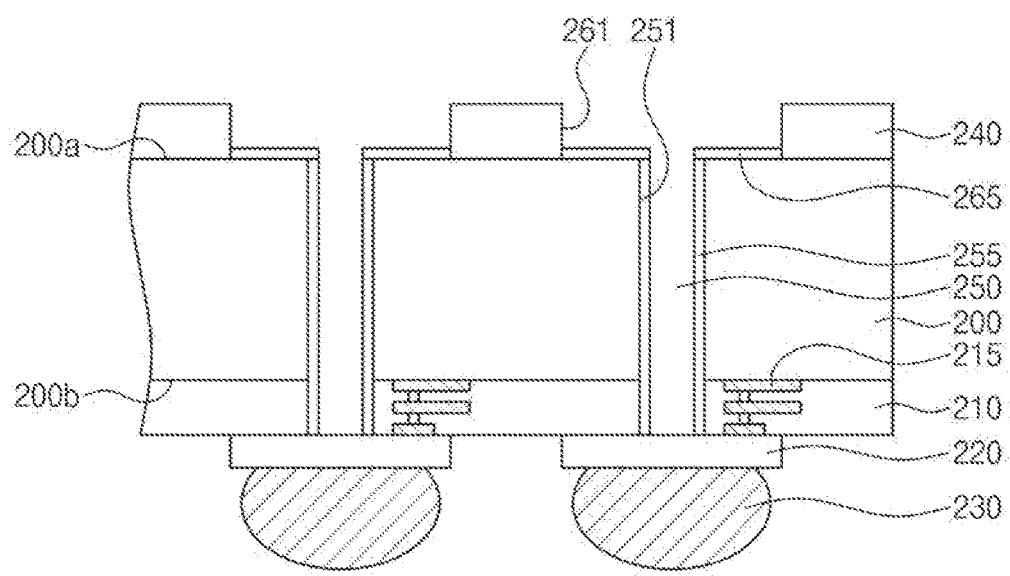

Referring to FIG. 4D, the via insulating layer 255 may be formed to cover a sidewall of the via-hole 251, and the pad insulating layer 265 may be formed to cover a portion of the first surface 200a of the semiconductor chip 200, which corresponds to a bottom surface of the recess region 261. The via insulating layer 255 may extend from the external pad 220 to the first surface 200a of the semiconductor chip 200. The pad insulating layer 265 may be in contact with the via insulating layer 255. The pad insulating layer 265 and the via insulating layer 255 may include the same material. The via insulating layer 255 and the pad insulating layer 265 may be formed using a chemical vapor deposition (CVD) process and/or an oxidation process.

Figure 4E:
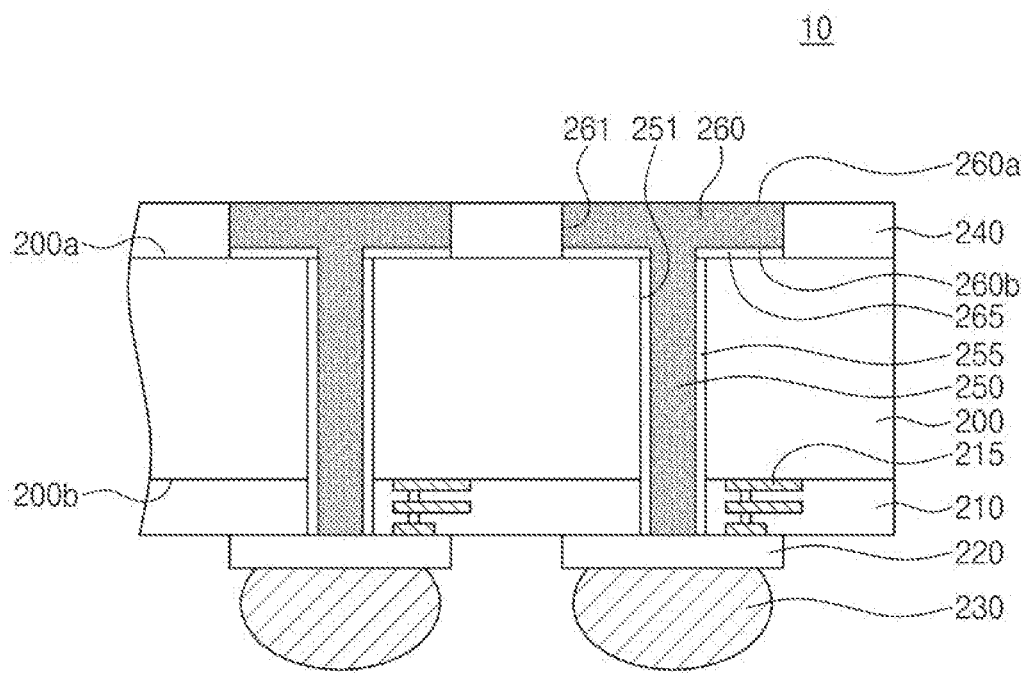

Referring to FIG. 4E, the via 250 filling the via-hole 251 and the connection pad 260 filling the recess region 261 may be formed by a single process, such as a plating process. The pad insulating layer 265 may form an insulative barrier between the semiconductor chip 200 and the connection pad 260, insulating the semiconductor chip 200 from the connection pad 260 to prevent electrical contact between them. The via insulating layer 255 may form an insulative barrier between the semiconductor chip 200 and the via 250, insulating the semiconductor chip 200 from the via 250 to prevent electrical contact between them. The via 250 and the connection pad 260 may include the same material. For example, the via 250 and the connection pad 260 may include copper (Cu). The via 250 may extend from the external pad 220 to the first surface 200a of the semiconductor chip 200. The connection pad 260 may be in contact with the via 250, and may not protrude outward from the upper insulating layer 240. The connection pad 260 may have the first surface 260a exposed outside the upper insulating layer 240, and the second surface 260b being opposite to the first surface 260a and being in contact with the pad insulating layer 265. The first surface 260a of the connection pad 260 may be coplanar with the surface of the upper insulating layer 240. Thus, the connection pad 260 may not protrude higher than a top surface of the upper insulating layer 240. The semiconductor device 10 of FIG. 3A may be formed through the plating process of the via 250 and the connection pad 260.

The via 250 and the connection pad 260 may be formed using the single plating process, and thus processes of manufacturing the semiconductor device 10 may be simplified. Since the manufacturing processes are simplified, process costs of the semiconductor device 10 may be reduced.

FIGS. 5A to 5E are cross-sectional views illustrating a method of manufacturing the semiconductor device illustrated in FIG. 3B. FIGS. 5A to 5E are enlarged cross-sectional views corresponding to a portion of the semiconductor device illustrated in FIG. 2. The descriptions to the same technical features as mentioned above will be omitted or mentioned briefly for the purpose of ease and convenience in explanation.

Figure 5A:
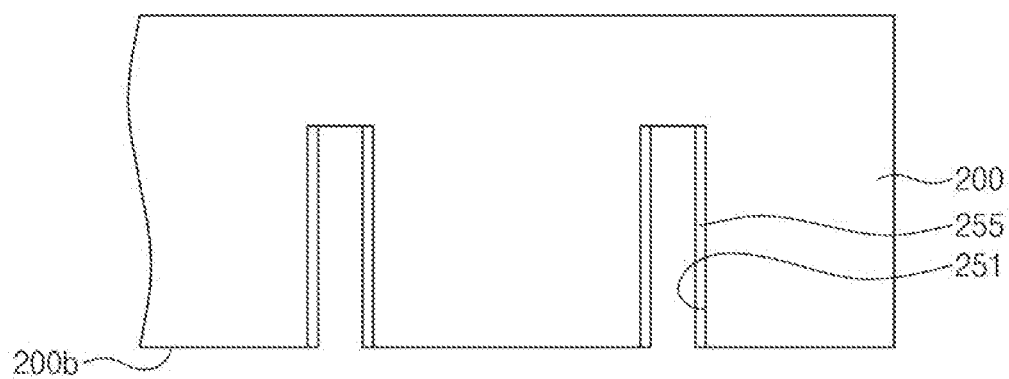
FIGS. 5A to 5E are cross-sectional views illustrating an exemplary method of manufacturing the semiconductor device illustrated in FIG. 3B.

Referring to FIG. 5A, the via-hole 251 opened at the second surface 200b of the semiconductor chip 200 may be formed in the semiconductor chip 200, and the via insulating layer 255 may be formed on the sidewall of the via-hole 251. The via-hole 251 may be formed using a first etching process, and the via insulating layer 255 may be formed using a CVD process or an oxidation process.

Figure 5B:
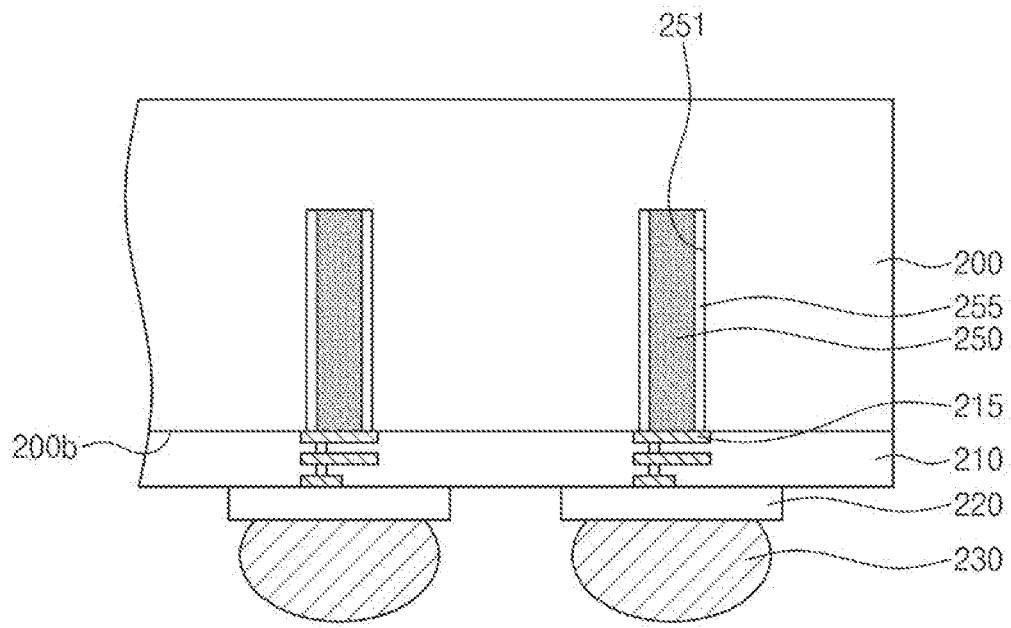

Referring to FIG. 5B, the via 250 may be formed to fill the via-hole 251, and the interlayer insulating layer 210 may be formed on the via 250. The via 250 may be formed using a plating process. The via 250 may include a conductive material, e.g., copper (Cu). The interlayer insulating layer 210 may include the metal interconnection 215. The external pad 220 and the external terminal 230 may be sequentially formed on the interlayer insulating layer 210. For example, the external pad 220 may be formed on the interlayer insulating layer 210, and the external terminal 230 may be formed on the external pad 220. The via 250, the external pad 220, and the external terminal 230 may be electrically connected to each other.

Figure 5C:
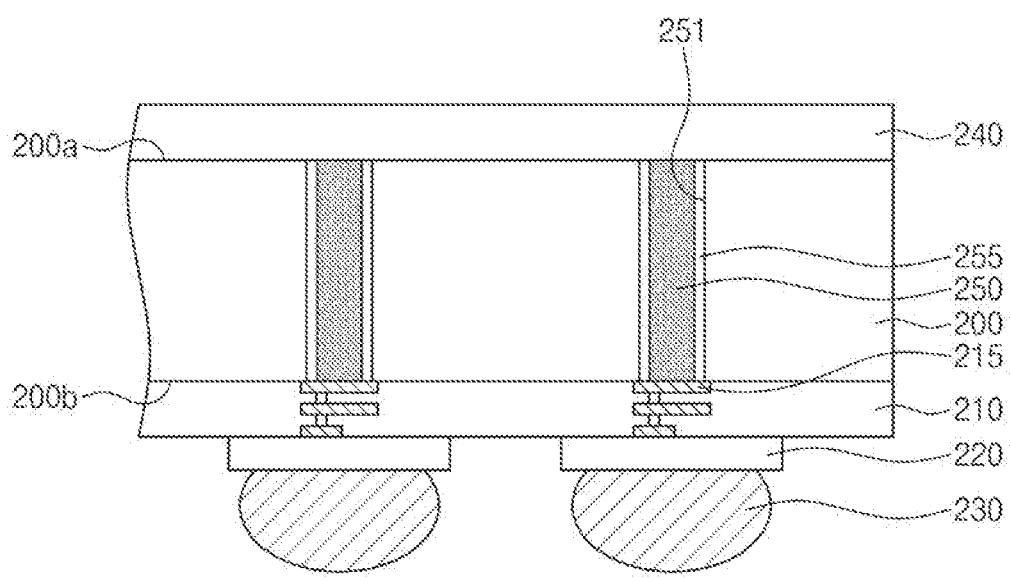

Referring to FIG. 5C, the semiconductor chip 200 may be polished or ground by a CMP process or a grinding process. The first surface 200a of the semiconductor chip 200 may be exposed by the CMP process or the grinding process. For example, the first surface 200a may be the non-active surface and the second surface 200b may be the active surface. The upper insulating layer 240 may be formed on the first surface 200a of the polished or ground semiconductor chip 200. The semiconductor chip 200 may be thinned by the CMP process or the grinding process described above. For example, a thickness of the semiconductor chip 200 may be reduced using a polishing or grinding process.

Figure 5D:
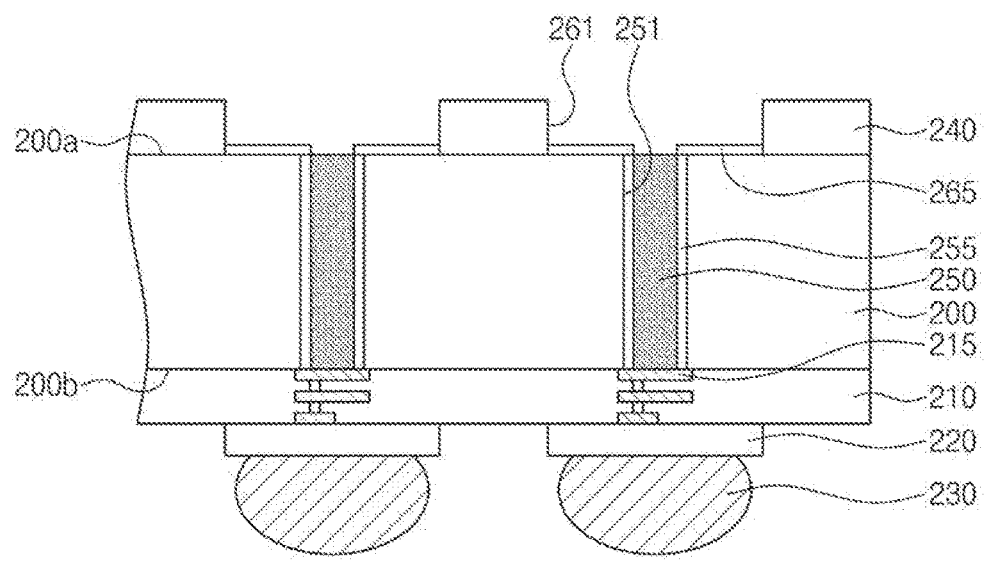

Referring to FIG. 5D, a recess region 261 may be formed in the upper insulating layer 240 by means of a second etching process. The recess region 261 may be recessed in the direction from the upper insulating layer 240 toward the semiconductor chip 200. For example, the recess region 261 may be recessed from a top surface of the upper insulating layer 240. The pad insulating layer 265 may be formed on the bottom surface of the recess region 261, and on a portion of the top surface 200a of the semiconductor chip 200. At this time, the pad insulating layer 265 may be formed in such a way to expose the via 250. The pad insulating layer 265 may be in contact with the via insulating layer 255. The pad insulating layer 265 and the via insulating layer 255 may include the same material. The pad insulating layer 265 may be formed using a CVD process or an oxidation process.

Figure 5E:
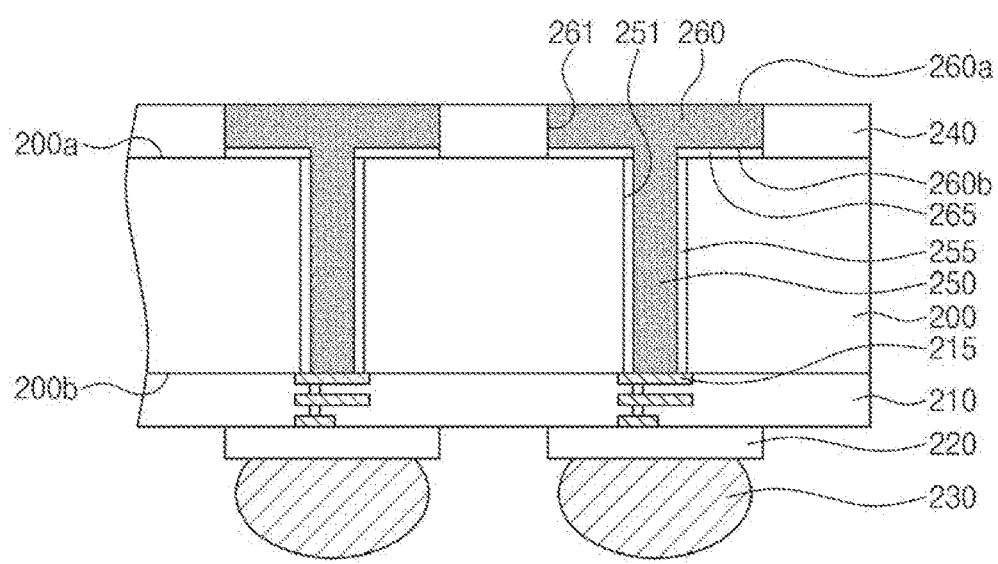

Referring to FIG. 5E, the connection pad 260 may be formed using a plating process. The connection pad 260 may be formed to fill the recess region 261. The connection pad 260 may be in contact with the via 250 and the pad insulating layer 265. The connection pad 260 may include the same metal material as the via 250. For example, the connection pad 260 may include copper (Cu). The pad insulating layer 265 may form an insulative barrier between the semiconductor chip 200 and the connection pad 260, insulating the semiconductor chip 200 from the connection pad 260 to prevent electrical contact between them. The via insulating layer 255 may form an insulative barrier between the semiconductor chip 200 and the via 250, insulating the semiconductor chip 200 from the via 250 to prevent electrical contact between them. The connection pad 260 may have the first surface 260a exposed outside the upper insulating layer 240, and the second surface 260b being opposite to the first surface 260a and being in contact with the pad insulating layer 265. The first surface 260a of the connection pad 260 may be coplanar with the surface of the upper insulating layer 240. Thus, the connection pad 260 may not protrude outward from the upper insulating layer 240. The semiconductor device 10 of FIG. 3B may be formed through the plating process of the connection pad 260.

In certain embodiments, the connection pad 260 may include a different material from the via 250. For example, the via 250 may include copper (Cu), and the connection pad 260 may include at least one selected from various metal materials such as copper (Cu), aluminum (Al), and nickel (Ni).

FIGS. 6A to 6E are cross-sectional views illustrating semiconductor devices according to some embodiments. FIGS. 6A to 6E are enlarged cross-sectional views corresponding to a portion of the semiconductor device 10 illustrated in FIG. 2. Hereinafter, semiconductor devices 10 having via-last structures will be described as examples. The descriptions to the same technical features as in the above embodiments will be omitted or mentioned briefly for the purpose of ease and convenience in explanation.

Figure 6A:
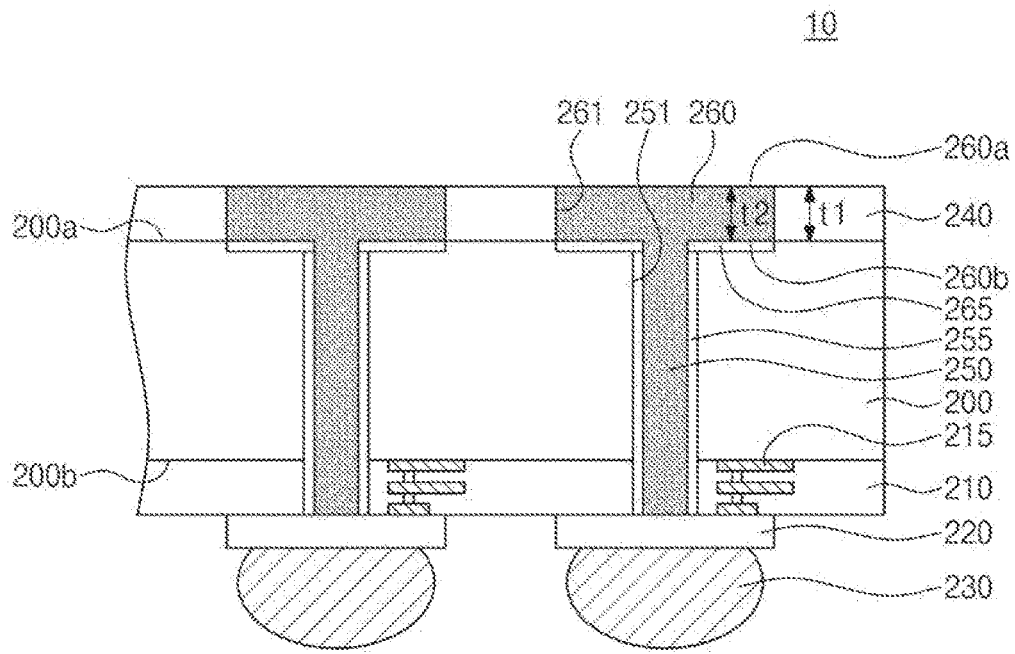
FIGS. 6A to 6E are cross-sectional views illustrating semiconductor devices according to some exemplary embodiments.

Referring to FIG. 6A, a recess region 261 recessed in the direction from the upper insulating layer 240 toward the semiconductor chip 200 may be provided. The recess region 261 may penetrate the upper insulating layer 240 and may be further recessed from the first surface 200a toward the second surface 200b of the semiconductor chip 200. For example, the recess region 261 may be recessed below the first surface 200a and extend into the semiconductor chip 200. The pad insulating layer 265 may be provided between the connection pad 260 and the bottom surface of the recess region 261. A thickness of the pad insulating layer 265 may be substantially the same as the distance the recess region 261 is recessed from the first surface 200a. At this time, a top surface of the pad insulating layer 265 may be substantially coplanar with the first surface 200a of the semiconductor chip 200. The upper insulating layer 240 may have a first thickness t1, and the connection pad 260 may have a second thickness t2 (e.g., thicknesses here referring to thickness in a vertical direction perpendicular to the surface first surface 200 of the semiconductor chip 200). The first thickness t1 may be substantially equal to the second thickness t2. The pad insulating layer 265 may form an insulative barrier between the semiconductor chip 200 and the connection pad 260, insulating the semiconductor chip 200 from the connection pad 260 to prevent electrical contact between the semiconductor chip 200 and the connection pad 260.

Figure 6B:
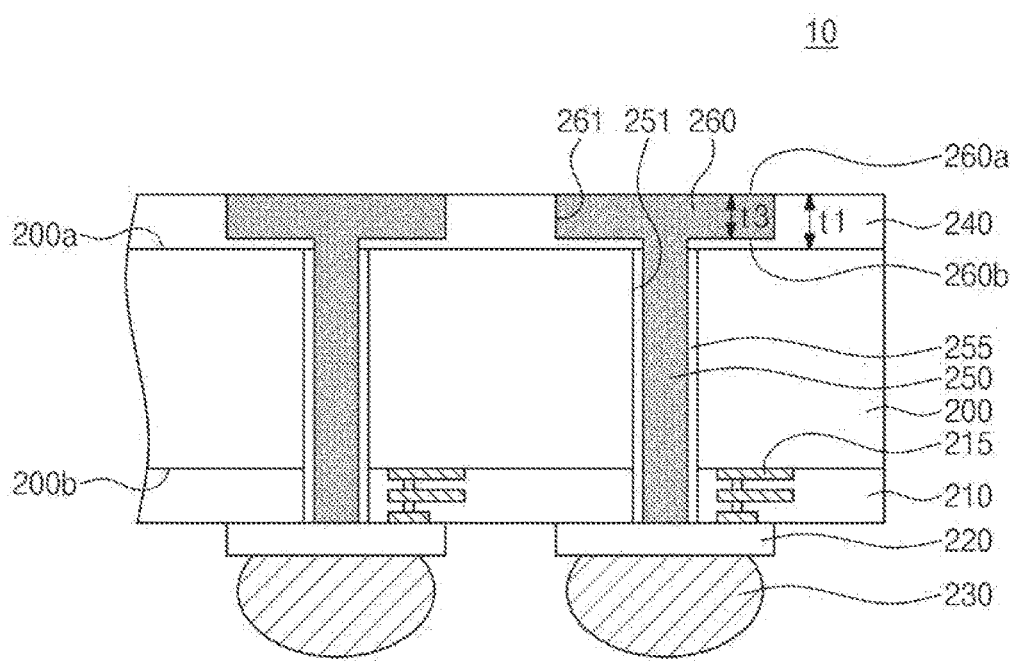

Referring to FIG. 6B, a recess region 261 recessed in the direction from the upper insulating layer 240 toward the semiconductor chip 200 may be provided. A portion of the upper insulating layer 240 may be recessed to form the recess region 261. In some embodiments, the bottom surface of the recess region 261 may be spaced apart from the first surface 200a of the semiconductor chip 200. For example, the bottom surface of the recess region 261 may be higher than the first surface 200a of the semiconductor chip 200. Thus, a portion of the upper insulating layer 240 may exist between the bottom surface of the recess region 261 and the first surface 200a of the semiconductor chip 200. The connection pad 260 may fill the recess region 261 so as to be disposed within the upper insulating layer 240. As a result, even though an additional insulating layer is not provided between the bottom surface of the recess region 261 and the connection pad 260, the connection pads 260 may be electrically insulated from each other and may be electrically insulated from the semiconductor chip 200. The upper insulating layer 240 may have the first thickness t1, and the connection pad 260 may have a third thickness t3. The first thickness t1 may be greater than the third thickness t3.

Figure 6C:
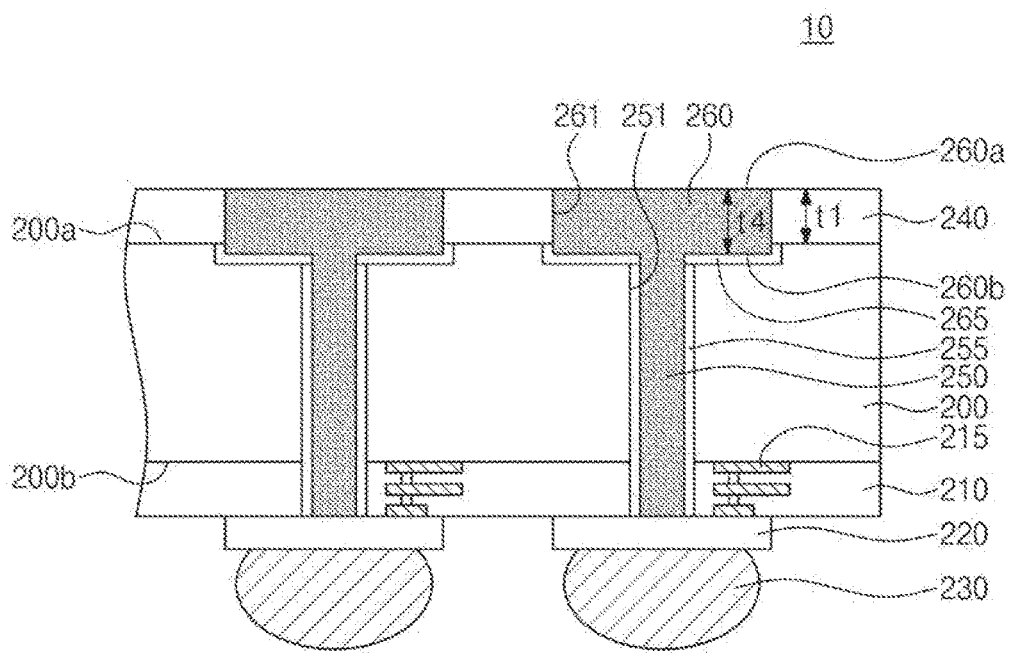

Referring to FIG. 6C, a recess region 261 recessed in the direction from the upper insulating layer 240 toward the semiconductor chip 200 may be provided. The recess region 261 may penetrate the upper insulating layer 240 and may be further recessed into a portion of the semiconductor chip 200. For example, the recess region 261 may be further recessed from the first surface 200a of semiconductor chip 200. The pad insulating layer 265 may be provided between the connection pad 260 and an inner surface of the recess region 261. The upper insulating layer 240 may have the first thickness t1, and the connection pad 260 may have a fourth thickness t4. The fourth thickness t4 may be greater than the first thickness t1. The pad insulating layer 265 may form an insulative barrier between the semiconductor chip 200 and the connection pad 260, insulating the semiconductor chip 200 from the connection pad 260 to prevent electrical contact between the semiconductor chip 200 and the connection pad 260.

Figure 6D:
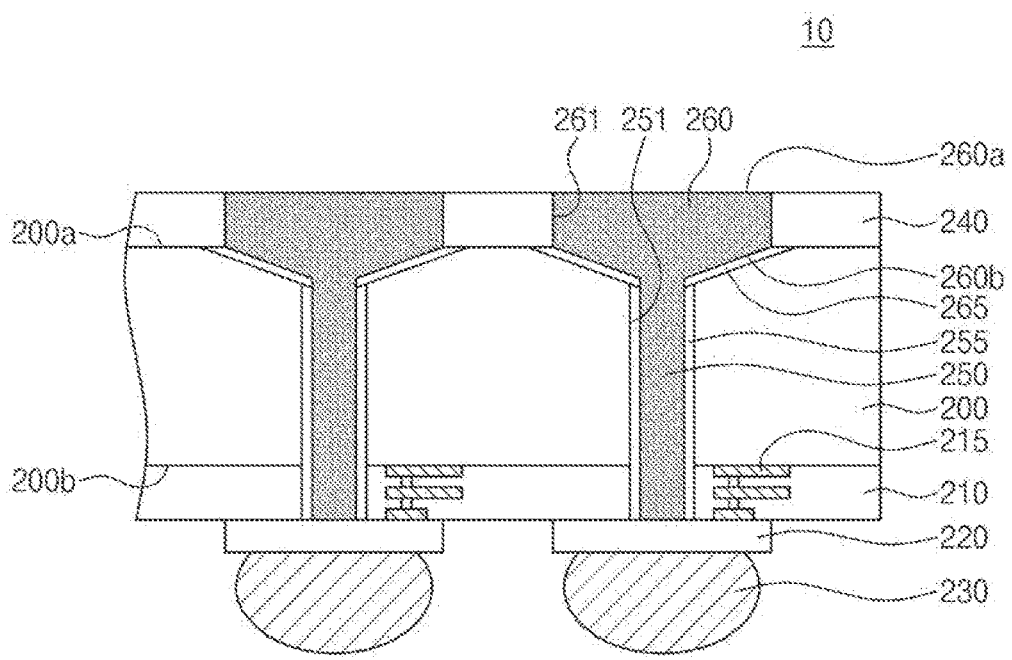

Referring to FIG. 6D, the connection pad 260 may have the first surface 260a exposed outside the upper insulating layer 240, and the second surface 260b being opposite to the first surface 260a and being in contact with the pad insulating layer 265. The second surface 260b of the connection pad 260 may be tapered in the direction from the upper insulating layer 240 toward the semiconductor chip 200. The first surface 260a of the connection pad 260 may be a flat surface. The first surface 260a of the connection pad 260 may be coplanar with a top surface of the upper insulating layer 240. The bottom surface of the recess region 261 may also be tapered in the direction from the upper insulating layer 240 toward the semiconductor chip 200 in correspondence to the second surface 260b of the connection pad 260.

Figure 6E:
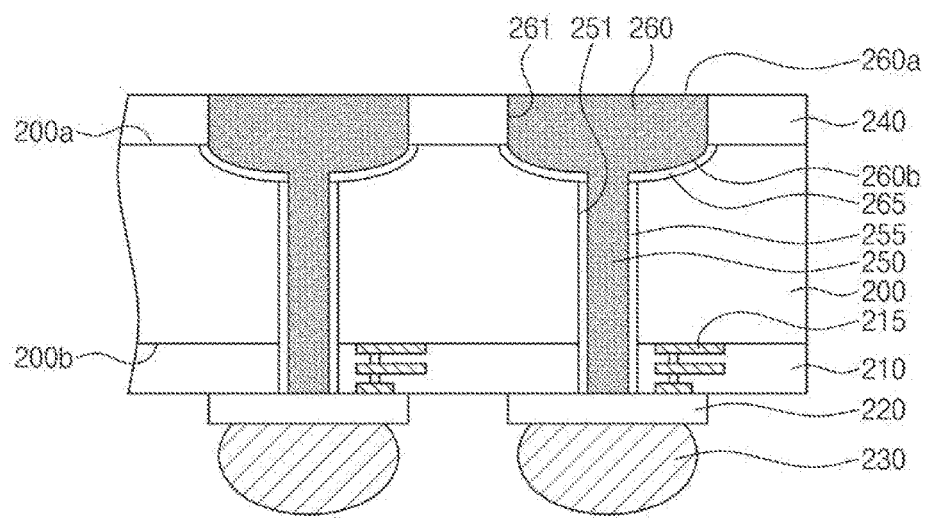

Referring to FIG. 6E, the second surface 260b of the connection pad 260 may be tapered in the direction from the upper insulating layer 240 toward the semiconductor chip 200. At this time, the second surface 260b of the connection pad 260 may be rounded. For example, the second surface 260b may be formed to have a concave shape relative to the upper insulating layer 240. The bottom surface of the recess region 261 may also be rounded in correspondence to the second surface 260b of the connection pad 260. The pad insulating layer 265 may form an insulative barrier between the semiconductor chip 200 and the connection pad 260, insulating the semiconductor chip 200 from the connection pad 260 to prevent electrical contact between the semiconductor chip 200 and the connection pad 260.

In certain embodiments, the semiconductor devices 10 may have the via-first structure or via-middle structure in which the via 250 is formed before the formation of the metal interconnection 215.

Shapes of the recess regions 261 and the connection pads 260 of the semiconductor devices according are not limited to the embodiments described above. In other word, the shapes of the recess regions 261 and the connection pads 260 may be variously modified. In addition, the thicknesses of the recess regions 261 and the connection pads 260 may be variously modified.

According to some embodiments, the surface of the upper insulating layer provided on the non-active surface of the semiconductor chip may be coplanar with the top surface of the connection pad. Thus, even though the tape used to move the semiconductor chip is detached from the upper insulating layer, a residue of the tape may not remain on the connection pad.

According to some embodiments, the via and the connection pad may be formed by one plating process, thereby simplifying the processes of manufacturing the semiconductor device.

While the concepts have been described with reference to example embodiments, it will be apparent to those skilled in the art that various changes and modifications may be made without departing from the spirits and scopes of the disclosed concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor device comprising:
   a semiconductor chip having an active surface and a non-active surface opposite to the active surface;
   an upper insulating layer provided on the non-active surface of the semiconductor chip;
   a via and a connection pad penetrating the semiconductor chip and the upper insulating layer, respectively, wherein the connection pad and the via comprise portions of a continuously formed same first material;
   a pad insulating layer provided on the non-active surface of the semiconductor chip, the pad insulating layer including a top surface contacting the first material forming a bottom surface of the connection pad, a first side surface contacting the first material forming a side of the via, and a second side surface contacting the upper insulating layer; and
   an external terminal provided directly on and electrically connected to the connection pad and vertically aligned with the via, the external terminal comprising solder,
   wherein the connection pad has a first surface exposed with respect to the upper insulating layer, a second surface opposite to the first surface and facing the semiconductor chip, and a first sidewall extending in a vertical direction from the first surface to the second surface,
   wherein the first sidewall contacts the upper insulating layer,
   wherein the upper insulating layer is a continuous layer that extends from the first sidewall to contact a second sidewall of an adjacent connection pad, and wherein the first surface of the connection pad is coplanar with an upper surface of the upper insulating layer.

2. The semiconductor device of claim 1, wherein the connection pad is provided in the upper insulating layer, and wherein a thickness of the connection pad is smaller than a thickness of the upper insulating layer.

3. The semiconductor device of claim 1, wherein the connection pad is provided in the upper insulating layer, and wherein a thickness of the connection pad is equal to or greater than a thickness of the upper insulating layer.

4. The semiconductor device of claim 1, wherein a width of the connection pad is greater than a width of the via.

5. The semiconductor device of claim 1, further comprising:
 a lower insulating layer disposed on the active surface; and
 an external pad disposed on the lower insulating layer,
 wherein the via penetrates the lower insulating layer so as to be electrically connected to the external-pad.

6. The semiconductor device of claim 1, wherein the connection pad and the via are integrally formed.

7. The semiconductor device of claim 6, wherein the connection pad and the via are formed of a same plating material.

8. A semiconductor device comprising:
 a semiconductor chip having a first surface and a second surface opposite to the first surface;
 an upper insulating layer provided on the first surface of the semiconductor chip;
 a lower insulating layer provided on the second surface of the semiconductor chip;
 an external pad disposed on the lower insulating layer and contacting the lower insulating layer;
 a via-hole penetrating the semiconductor chip and extending into the lower insulating layer to the external pad;
 a connection pad provided on the first surface;
 a via connected to the connection pad and provided in the via-hole so as to be electrically connected to the external pad, wherein the connection pad and the via comprise portions of a continuously formed same first material;
 a pad insulating layer provided on the first surface of the semiconductor chip, the pad insulating layer including a top surface contacting the first material forming a bottom surface of the connection pad, a first side surface contacting the first material forming a side of the via, and a second side surface contacting the upper insulating layer; and
 an external terminal provided directly on and electrically connected to the connection pad and vertically aligned with the via, the external terminal comprising solder,
 wherein the connection pad has a bottom directly connected to the via and has a top surface opposite to the bottom, and
 wherein the top surface of the connection pad is coplanar with a top surface of the upper insulating layer.

9. The semiconductor device of claim 8, wherein the via and the connection pad are formed of the same metal material, and
 wherein the same metal material includes copper.

10. The semiconductor device of claim 8, wherein the upper insulating layer has a recess region recessed from the top surface of the upper insulating layer toward the first surface of the semiconductor chip, and
 wherein the connection pad is provided in the recess region.

11. The semiconductor device of claim 8, further comprising:
 a via insulating layer provided between the via and a sidewall of the via-hole to surround the via.

12. The semiconductor device of claim 8, wherein the connection pad and the via are integrally formed of a same plating material.

13. A semiconductor device comprising:
 a semiconductor chip having an active surface and a non-active surface opposite to the active surface;
 an upper insulating layer provided on the non-active surface of the semiconductor chip;
 a lower insulating layer provided on the active surface of the semiconductor chip;
 a connection pad provided on the non-active surface of the semiconductor chip;
 a via connected to the connection pad and provided in a via-hole, wherein the connection pad and the via comprise portions of a continuously formed same first material;
 a pad insulating layer provided on the non-active surface of the semiconductor chip, the pad insulating layer including a top surface contacting the first material forming a bottom surface of the connection pad, a first side surface contacting the first material forming a side of the via, and a second side surface contacting the upper insulating layer; and
 an external terminal provided directly on and electrically connected to the connection pad and vertically aligned with the via, the external terminal comprising solder,
 wherein the connection pad has a first surface exposed outside the upper insulating layer, a second surface opposite to the first surface and facing the semiconductor chip, and a first sidewall extending in a vertical direction from the first surface to the second surface and contacting the upper insulating layer,
 wherein the upper insulating layer is a continuous layer that extends from the first sidewall to contact a second sidewall of an adjacent connection pad, and
 wherein the first surface of the connection pad is coplanar with an upper surface of the upper insulating layer.

14. The semiconductor device of claim 13, wherein the via-hole penetrates into the lower insulating layer.

15. The semiconductor device of claim 13, wherein the upper insulating layer has a recess region recessed from a top surface of the upper insulating layer toward the non-active surface of the semiconductor chip, and
 wherein the connection pad is provided in the recess region.

16. The semiconductor device of claim 13, wherein the via-hole penetrates the semiconductor chip and extends to the lower insulating layer.

17. The semiconductor device of claim 13, further comprising:
 a via insulating layer provided between the via and a sidewall of the via-hole to surround the via.

18. The semiconductor device of claim 13, wherein the connection pad and the via are integrally formed of a same plating material.

19. The semiconductor device of claim 13, further comprising:
 a lower insulating layer disposed on the active surface; and an external pad disposed on the lower insulating layer and contacting the lower insulating layer,
wherein the via penetrates the lower insulating layer so as to be electrically connected to the external pad.

* * * * *